(12) United States Patent
Kutney et al.

(10) Patent No.: US 8,048,806 B2
(45) Date of Patent: Nov. 1, 2011

(54) METHODS TO AVOID UNSTABLE PLASMA STATES DURING A PROCESS TRANSITION

(75) Inventors: Michael C. Kutney, Santa Clara, CA (US); Daniel J. Hoffman, Saratoga, CA (US); Gerardo A. Delgadino, Santa Clara, CA (US); Ezra R. Gold, Sunnyvale, CA (US); Ashok Sinha, Mountain View, CA (US); Xiaoye Zhao, Palo Alto, CA (US); Douglas H. Burns, Saratoga, CA (US); Shawming Ma, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 1180 days.

(21) Appl. No.: 11/372,752

(22) Filed: Mar. 10, 2006
(Under 37 CFR 1.47)

(65) Prior Publication Data
US 2007/0066064 A1 Mar. 22, 2007

Related U.S. Application Data

(60) Continuation-in-part of application No. 11/366,301, filed on Mar. 1, 2006, which is a continuation-in-part of application No. 11/046,656, filed on Jan. 28, 2005, which is a continuation-in-part of application No. 10/841,116, filed on May 7, 2004, now abandoned, which is a division of application No. 10/192,271, filed on Jul. 9, 2002, now Pat. No. 6,853,141, said application No. 11/366,301 is a continuation-in-part of application No. 11/046,538, filed on Jan. 28, 2005, now Pat. No. 7,196,283, which is a continuation-in-part of application No. 10/754,280, filed on Jan. 8, 2004, now Pat. No. 7,220,937, which is a continuation-in-part of application No. 10/028,922, filed on Dec. 19, 2001, now Pat. No. 7,030,335, which is a continuation-in-part of application No. 09/527,342, filed on Mar. 17, 2000, now Pat. No. 6,528,751.

(60) Provisional application No. 60/660,662, filed on Mar. 11, 2005.

(51) Int. Cl.
*H01L 21/00* (2006.01)
*H01L 21/302* (2006.01)
*G01L 21/30* (2006.01)

(52) U.S. Cl. .................. 438/689; 216/59; 257/E21.252; 257/321.579; 438/5

(58) Field of Classification Search .................. None
See application file for complete search history.

(56) References Cited

U.S. PATENT DOCUMENTS 2,951,960 A 9/1960 Watrous, Jr.
(Continued)

FOREIGN PATENT DOCUMENTS

EP 0343500 11/1989
(Continued)

OTHER PUBLICATIONS

King, Ronald W.P., "Transmission-Line Theory." Dover Publications, Inc., 1965, New York, pp. 1-10 and 282-286.
(Continued)

*Primary Examiner* — Allan Olsen
(74) *Attorney, Agent, or Firm* — Blakely, Sokoloff, Taylor & Zafman

(57) ABSTRACT

In some implementations, a method is provided in a plasma processing chamber for stabilizing etch-rate distributions during a process transition from one process step to another process step. The method includes performing a pre-transition compensation of at least one other process parameter so as to avoid unstable plasma states by inhibiting formation of a parasitic plasma during the process transition. In some implementations, a method is provided for processing a workpiece in plasma processing chamber, which includes inhibiting deviations from an expected etch-rate distribution by avoiding unstable plasma states during a process transition from one process step to another process step.

13 Claims, 4 Drawing Sheets

U.S. PATENT DOCUMENTS

| | | | |
|---|---|---|---|
| 2,967,926 A | 1/1961 | Edstrom | |
| 3,355,615 A | 11/1967 | Bihan et al. | |
| 3,610,986 A | 10/1971 | King | |
| 4,293,794 A | 10/1981 | Kapetanakos | |
| 4,401,054 A | 8/1983 | Matsuo et al. | |
| 4,438,368 A | 3/1984 | Abe et al. | |
| 4,458,180 A | 7/1984 | Sohval | |
| 4,464,223 A | 8/1984 | Gorin | |
| 4,526,643 A | 7/1985 | Okano et al. | |
| 4,552,639 A | 11/1985 | Garrett | |
| 4,570,106 A | 2/1986 | Sohval et al. | |
| 4,579,618 A | 4/1986 | Celestino et al. | |
| 4,600,492 A | 7/1986 | Ooshio et al. | |
| 4,631,106 A | 12/1986 | Nakazato et al. | |
| 4,665,487 A | 5/1987 | Ogawa et al. | |
| 4,665,489 A | 5/1987 | Suzuki et al. | |
| 4,668,338 A | 5/1987 | Maydan et al. | |
| 4,668,365 A | 5/1987 | Foster et al. | |
| 4,740,268 A | 4/1988 | Bukhman | |
| 4,792,378 A | 12/1988 | Rose et al. | |
| 4,829,215 A | 5/1989 | Kim et al. | |
| 4,842,683 A | 6/1989 | Cheng et al. | |
| 4,859,908 A | 8/1989 | Yoshida et al. | |
| 4,888,518 A | 12/1989 | Grunwald | |
| 4,947,085 A | 8/1990 | Nakanishi et al. | |
| 4,950,956 A | 8/1990 | Asamaki et al. | |
| 4,963,242 A | 10/1990 | Sato et al. | |
| 4,973,883 A | 11/1990 | Hirose | |
| 4,990,229 A | 2/1991 | Campbell et al. | |
| 5,006,760 A | 4/1991 | Drake, Jr. | |
| 5,017,835 A | 5/1991 | Oechsner | |
| 5,032,202 A | 7/1991 | Tsai et al. | |
| 5,053,678 A | 10/1991 | Koike et al. | |
| 5,055,853 A | 10/1991 | Garnier | |
| 5,061,838 A | 10/1991 | Lane et al. | |
| 5,074,456 A | 12/1991 | Degner et al. | |
| 5,077,499 A | 12/1991 | Oku | |
| 5,079,481 A | 1/1992 | Moslehi | |
| 5,081,398 A | 1/1992 | Asmussen et al. | |
| 5,087,857 A | 2/1992 | Ahn | |
| 5,089,083 A | 2/1992 | Kojima et al. | |
| 5,107,170 A | 4/1992 | Ishikawa et al. | |
| 5,115,167 A | 5/1992 | Ootera et al. | |
| 5,120,466 A | 6/1992 | Katagiri et al. | |
| 5,122,251 A | 6/1992 | Campbell et al. | |
| 5,140,223 A | 8/1992 | Gesche | |
| 5,145,554 A * | 9/1992 | Seki et al. | 438/712 |
| 5,175,472 A | 12/1992 | Johnson, Jr. et al. | |
| 5,195,045 A | 3/1993 | Keane et al. | |
| 5,198,725 A | 3/1993 | Chen et al. | |
| 5,208,512 A | 5/1993 | Forster et al. | |
| 5,210,466 A | 5/1993 | Collins et al. | |
| 5,211,825 A | 5/1993 | Saito et al. | |
| 5,213,658 A | 5/1993 | Ishida | |
| 5,215,619 A | 6/1993 | Cheng et al. | |
| 5,218,271 A | 6/1993 | Egorov et al. | |
| 5,223,457 A | 6/1993 | Mintz et al. | |
| 5,225,024 A | 7/1993 | Hanley et al. | |
| 5,246,532 A | 9/1993 | Ishida | |
| 5,252,194 A | 10/1993 | Demaray et al. | |
| 5,256,931 A | 10/1993 | Bernadet | |
| 5,272,417 A | 12/1993 | Ohmi | |
| 5,273,610 A | 12/1993 | Thomas, III et al. | |
| 5,274,306 A | 12/1993 | Kaufman et al. | |
| 5,279,669 A | 1/1994 | Lee | |
| 5,280,219 A | 1/1994 | Ghanbari | |
| 5,300,460 A | 4/1994 | Collins et al. | |
| 5,304,279 A | 4/1994 | Coultas et al. | |
| 5,308,417 A | 5/1994 | Groechel et al. | |
| 5,312,778 A | 5/1994 | Collins et al. | |
| 5,314,603 A | 5/1994 | Sugiyama et al. | |
| 5,325,019 A | 6/1994 | Miller et al. | |
| 5,345,145 A | 9/1994 | Harafuji et al. | |
| 5,401,351 A | 3/1995 | Samukawa | |
| 5,432,315 A | 7/1995 | Kaji et al. | |
| 5,433,836 A | 7/1995 | Martin et al. | |
| 5,444,207 A | 8/1995 | Sekine et al. | |
| 5,449,977 A | 9/1995 | Nakagawa et al. | |
| 5,453,305 A | 9/1995 | Lee | |
| 5,463,525 A | 10/1995 | Barnes et al. | |
| 5,467,013 A | 11/1995 | Williams et al. | |
| 5,474,648 A | 12/1995 | Patrick et al. | |
| 5,503,676 A | 4/1996 | Shufflebotham et al. | |
| 5,506,475 A | 4/1996 | Alton | |
| 5,512,130 A | 4/1996 | Barna et al. | |
| 5,519,373 A | 5/1996 | Miyata | |
| 5,527,394 A | 6/1996 | Heinrich et al. | |
| 5,534,070 A | 7/1996 | Okamura et al. | |
| 5,534,108 A | 7/1996 | Qian et al. | |
| 5,537,004 A | 7/1996 | Imahashi et al. | |
| 5,554,223 A | 9/1996 | Imahashi | |
| 5,556,549 A | 9/1996 | Patrick et al. | |
| 5,556,717 A | 9/1996 | Kondo | |
| 5,565,382 A | 10/1996 | Tseng et al. | |
| 5,567,268 A | 10/1996 | Kadomura | |
| 5,576,600 A | 11/1996 | McCrary et al. | |
| 5,576,629 A | 11/1996 | Turner et al. | |
| 5,587,038 A | 12/1996 | Cecchi et al. | |
| 5,592,055 A | 1/1997 | Capacci et al. | |
| 5,595,627 A | 1/1997 | Inazawa et al. | |
| 5,605,637 A | 2/1997 | Shan et al. | |
| 5,618,382 A | 4/1997 | Mintz et al. | |
| 5,627,435 A | 5/1997 | Jansen et al. | |
| 5,659,276 A | 8/1997 | Miyata | |
| 5,660,671 A | 8/1997 | Harada et al. | |
| 5,662,770 A | 9/1997 | Donohoe | |
| 5,662,819 A | 9/1997 | Kadomura | |
| 5,685,914 A | 11/1997 | Hills et al. | |
| 5,705,019 A | 1/1998 | Yamada et al. | |
| 5,707,486 A | 1/1998 | Collins | |
| 5,710,486 A | 1/1998 | Ye et al. | |
| 5,717,294 A | 2/1998 | Sakai et al. | |
| 5,718,795 A | 2/1998 | Plavidal et al. | |
| 5,720,826 A | 2/1998 | Hayashi et al. | |
| 5,726,412 A | 3/1998 | Briffod et al. | |
| 5,733,511 A | 3/1998 | de Francesco | |
| 5,759,424 A * | 6/1998 | Imatake et al. | 216/60 |
| 5,770,922 A | 6/1998 | Gerrish et al. | |
| 5,783,102 A | 7/1998 | Keller | |
| 5,792,376 A | 8/1998 | Kanai et al. | |
| 5,798,029 A | 8/1998 | Morita | |
| 5,824,607 A | 10/1998 | Trow et al. | |
| 5,846,885 A | 12/1998 | Kamata et al. | |
| 5,849,136 A | 12/1998 | Mintz et al. | |
| 5,849,372 A | 12/1998 | Annaratone et al. | |
| 5,855,685 A | 1/1999 | Tobe et al. | |
| 5,855,725 A | 1/1999 | Sakai | |
| 5,858,819 A | 1/1999 | Miyasaka | |
| 5,863,376 A | 1/1999 | Wicker et al. | |
| 5,866,986 A | 2/1999 | Pennington | |
| 5,868,848 A | 2/1999 | Tsukamoto | |
| 5,876,576 A | 3/1999 | Fu | |
| 5,880,034 A | 3/1999 | Keller | |
| 5,885,358 A | 3/1999 | Maydan et al. | |
| 5,902,461 A | 5/1999 | Xu et al. | |
| 5,904,799 A | 5/1999 | Donohoe | |
| 5,907,220 A | 5/1999 | Tepman et al. | |
| 5,914,568 A | 6/1999 | Nonaka | |
| 5,929,717 A | 7/1999 | Richardson et al. | |
| 5,936,481 A | 8/1999 | Fujii | |
| 5,939,886 A | 8/1999 | Turner et al. | |
| 5,942,074 A | 8/1999 | Lenz et al. | |
| 5,945,008 A | 8/1999 | Kisakibaru et al. | |
| 5,958,140 A | 9/1999 | Arami et al. | |
| 5,971,591 A | 10/1999 | Vona et al. | |
| 5,997,962 A | 12/1999 | Ogasawara et al. | |
| 6,000,360 A | 12/1999 | Koshimizu | |
| 6,014,943 A | 1/2000 | Arami et al. | |
| 6,015,476 A | 1/2000 | Schlueter et al. | |
| 6,016,131 A | 1/2000 | Sato et al. | |
| 6,030,486 A | 2/2000 | Loewenhardt et al. | |
| 6,043,608 A | 3/2000 | Samukawa et al. | |
| 6,051,151 A | 4/2000 | Keller et al. | |
| 6,063,236 A | 5/2000 | Sakai | |
| 6,073,577 A | 6/2000 | Lilleland et al. | |
| 6,074,518 A * | 6/2000 | Imafuku et al. | 156/345.46 |
| 6,076,482 A | 6/2000 | Ding et al. | |

| | | | |
|---|---|---|---|
| 6,079,356 A | 6/2000 | Umotoy et al. | |
| 6,085,688 A | 7/2000 | Lymberopoulos et al. | |
| 6,089,182 A | 7/2000 | Hama | |
| 6,093,457 A | 7/2000 | Okumura et al. | |
| 6,095,084 A | 8/2000 | Shamouilian et al. | |
| 6,096,160 A | 8/2000 | Kadomura | |
| 6,106,663 A | 8/2000 | Kuthi et al. | |
| 6,110,395 A | 8/2000 | Gibson, Jr. | |
| 6,142,096 A | 11/2000 | Sakai et al. | |
| 6,152,071 A | 11/2000 | Akiyama et al. | |
| 6,155,200 A | 12/2000 | Horijke et al. | |
| 6,162,709 A | 12/2000 | Raoux et al. | |
| 6,174,450 B1 | 1/2001 | Patrick et al. | |
| 6,251,216 B1 | 1/2001 | Okamura et al. | |
| 6,188,564 B1 | 2/2001 | Hao | |
| 6,190,495 B1 | 2/2001 | Kubota et al. | |
| 6,213,050 B1 | 4/2001 | Liu et al. | |
| 6,213,959 B1 | 4/2001 | Liu et al. | |
| 6,218,312 B1 | 4/2001 | Collins et al. | |
| 6,228,235 B1 | 5/2001 | Tepman et al. | |
| 6,245,190 B1 | 6/2001 | Masuda et al. | |
| 6,247,242 B1 | 6/2001 | Fu et al. | |
| 6,255,220 B1 | 7/2001 | Kisakibaru et al. | |
| 6,262,538 B1 | 7/2001 | Keller | |
| 6,274,008 B1 | 8/2001 | Gopalraja et al. | |
| 6,277,249 B1 | 8/2001 | Gopalraja et al. | |
| 6,284,673 B2 | 9/2001 | Dunham | |
| 6,290,806 B1 | 9/2001 | Donohoe | |
| 6,291,999 B1 | 9/2001 | Nishimori et al. | |
| 6,294,026 B1 | 9/2001 | Roithner et al. | |
| 6,296,747 B1 | 10/2001 | Tanaka | |
| 6,300,227 B1 | 10/2001 | Liu et al. | |
| 6,337,292 B1 | 1/2002 | Kim et al. | |
| 6,346,915 B1 | 2/2002 | Okumura et al. | |
| RE37,580 E | 3/2002 | Barnes et al. | |
| 6,376,388 B1 | 4/2002 | Hashimoto et al. | |
| 6,382,129 B1 | 5/2002 | Nikulin | |
| 6,392,350 B1 | 5/2002 | Amano | |
| 6,404,088 B1 | 6/2002 | Barada et al. | |
| 6,415,736 B1 | 7/2002 | Hao et al. | |
| 6,431,297 B1 | 8/2002 | Nakazawa | |
| 6,432,259 B1 | 8/2002 | Noorbakhsh et al. | |
| 6,436,230 B1 | 8/2002 | Kondo et al. | |
| 6,436,388 B2 | 8/2002 | Kudo et al. | |
| 6,444,039 B1 | 9/2002 | Nguyen | |
| 6,444,104 B2 | 9/2002 | Gopalraja et al. | |
| 6,449,568 B1 | 9/2002 | Gerrish | |
| 6,451,177 B1 | 9/2002 | Gopalraja et al. | |
| 6,451,703 B1 | 9/2002 | Liu et al. | |
| 6,462,481 B1 | 10/2002 | Holland et al. | |
| 6,475,335 B1 | 11/2002 | Yin et al. | |
| 6,485,617 B2 | 11/2002 | Fu et al. | |
| 6,485,618 B2 | 11/2002 | Gopalraja et al. | |
| 6,488,807 B1 | 12/2002 | Collins et al. | |
| 6,491,801 B1 | 12/2002 | Gung | |
| 6,495,009 B1 | 12/2002 | Gung | |
| 6,506,687 B1 * | 1/2003 | Izawa et al. | 438/729 |
| 6,507,155 B1 | 1/2003 | Barnes et al. | |
| 6,521,082 B1 | 2/2003 | Barnes et al. | |
| 6,545,580 B2 | 4/2003 | Hedge et al. | |
| 6,579,421 B1 | 6/2003 | Fu | |
| 6,586,886 B1 | 7/2003 | Katz et al. | |
| 6,599,399 B2 | 7/2003 | Xu et al. | |
| 6,610,184 B2 | 8/2003 | Ding et al. | |
| 6,613,689 B2 | 9/2003 | Liu et al. | |
| 6,627,050 B2 | 9/2003 | Miller et al. | |
| 6,639,950 B1 | 10/2003 | Lagerblom et al. | |
| 6,652,712 B2 | 11/2003 | Wang et al. | |
| 6,674,241 B2 | 11/2003 | Strang et al. | |
| 6,599,367 B1 | 12/2003 | Nakatsuka | |
| 6,663,715 B1 | 12/2003 | Yuda et al. | |
| 6,663,754 B2 | 12/2003 | Gung | |
| 6,673,199 B1 | 1/2004 | Yamartino et al. | |
| 6,528,751 B1 | 3/2004 | Hoffman et al. | |
| 6,700,376 B2 | 3/2004 | Goto et al. | |
| 6,716,302 B2 | 4/2004 | Carducci et al. | |
| 6,761,804 B2 | 7/2004 | Perrin | |
| 6,764,575 B1 | 7/2004 | Yamasaki et al. | |
| 6,767,429 B2 | 7/2004 | Amano | |
| 6,787,006 B2 | 9/2004 | Gopalraja et al. | |
| 6,797,639 B2 | 9/2004 | Carducci et al. | |
| 6,805,770 B1 | 10/2004 | Oster | |
| 6,818,097 B2 | 11/2004 | Yamaguchi et al. | |
| 6,853,141 B2 | 2/2005 | Hoffman et al. | |
| 6,858,263 B2 * | 2/2005 | Satoh | 427/569 |
| 6,872,259 B2 | 3/2005 | Strang | |
| 6,894,245 B2 | 5/2005 | Hoffman et al. | |
| 6,937,127 B2 | 8/2005 | Oster | |
| 7,030,335 B2 | 4/2006 | Hoffman et al. | |
| 7,141,757 B2 * | 11/2006 | Hoffman et al. | 219/121.43 |
| 7,163,641 B2 | 1/2007 | Donohoe et al. | |
| 7,196,283 B2 * | 3/2007 | Buchberger et al. | 219/121.43 |
| 7,218,503 B2 | 5/2007 | Howald | |
| 7,285,228 B2 * | 10/2007 | Laermer et al. | 216/67 |
| 7,422,654 B2 | 9/2008 | Lindley et al. | |
| 7,458,335 B1 | 12/2008 | Bjorkman | |
| 7,481,886 B2 | 1/2009 | Kato et al. | |
| 2002/0092618 A1 | 7/2002 | Collins | |
| 2002/0108933 A1 | 8/2002 | Hoffman et al. | |
| 2002/0139477 A1 | 10/2002 | Ni et al. | |
| 2002/0179443 A1 | 12/2002 | Hada et al. | |
| 2003/0085000 A1 | 5/2003 | Horioka et al. | |
| 2003/0132195 A1 | 7/2003 | Edamura et al. | |
| 2003/0148040 A1 * | 8/2003 | Satoh | 427/569 |
| 2003/0168427 A1 | 9/2003 | Flamm et al. | |
| 2003/0218427 A1 | 11/2003 | Hoffman et al. | |
| 2004/0011467 A1 | 1/2004 | Hemker et al. | |
| 2004/0035365 A1 * | 2/2004 | Yamazawa et al. | 118/723 E |
| 2004/0056602 A1 | 3/2004 | Yang et al. | |
| 2004/0134611 A1 | 7/2004 | Kato et al. | |
| 2004/0134615 A1 * | 7/2004 | Breitschwerdt et al. | 156/345.43 |
| 2004/0182516 A1 | 9/2004 | Lindley et al. | |
| 2004/0233027 A1 | 11/2004 | Oster | |
| 2005/0001556 A1 | 1/2005 | Hoffman et al. | |
| 2005/0126710 A1 * | 6/2005 | Laermer et al. | 156/345.33 |
| 2005/0167051 A1 | 8/2005 | Hoffman et al. | |
| 2005/0178748 A1 * | 8/2005 | Buchberger et al. | 219/121.48 |
| 2006/0157201 A1 | 7/2006 | Hoffman et al. | |
| 2006/0169410 A1 * | 8/2006 | Maeda et al. | 156/345.28 |
| 2006/0175016 A1 * | 8/2006 | Edamura et al. | 156/345.48 |
| 2007/0212811 A1 * | 9/2007 | Hanawa et al. | 438/104 |
| 2007/0236148 A1 * | 10/2007 | Yamazawa et al. | 315/111.21 |
| 2007/0251920 A1 | 11/2007 | Hoffman | |
| 2008/0023143 A1 | 1/2008 | Hoffman | |
| 2008/0044960 A1 * | 2/2008 | Al-Bayati et al. | 438/156 |
| 2008/0210376 A1 * | 9/2008 | Maeda et al. | 156/345.24 |

FOREIGN PATENT DOCUMENTS

| | | |
|---|---|---|
| EP | 0678903 | 10/1995 |
| EP | 0719447 | 7/1998 |
| EP | 1686612 | 8/2006 |
| JP | 60094725 | 5/1985 |
| JP | 01218106 | 8/1989 |
| JP | 02224239 | 9/1990 |
| JP | 4247878 | 9/1992 |
| JP | 05021391 | 1/1993 |
| JP | 07235396 | 9/1995 |
| JP | 08167588 | 6/1996 |
| JP | 2001185542 | 7/2001 |
| JP | 2001319920 | 11/2001 |
| JP | 20020203840 | 7/2002 |
| JP | 11016893 | 12/2003 |
| TW | 497173 | 8/2002 |
| TW | 589659 | 6/2004 |
| WO | WO0137315 | 5/2001 |
| WO | WO0171765 | 9/2001 |
| WO | WO0175188 | 10/2001 |
| WO | WO03100818 | 12/2003 |
| WO | WO2004022238 | 3/2004 |

OTHER PUBLICATIONS

Office Action for U.S. Appl. No. 11/360,944, dated Nov. 23, 2010, 9 pages.
Office Action for U.S. Appl. No. 11/360,944, dated Jun. 22, 2010, 9 pages.
Notice of Reasons for Rejection for JP Application No. 2006-109588, dated Nov. 24, 2009.

Office Action for U.S. Appl. No. 11/360,944, dated Apr. 14, 2009, 5 pages.
Office Action for U.S. Appl. No. 11/807,194, dated Oct. 26, 2009, 13 pages.
Office Action for U.S. Appl. No. 11/360,944, dated Oct. 29, 2009, 9 pages.
Office Action for U.S. Appl. No. 11/366,301, dated Jan. 21, 2011, 7 pages.
Office Action for U.S. Appl. No. 11/881,801, dated Jan. 25, 2010, 6 pages.
Office Action for U.S. Appl. No. 11/881,801, dated Feb. 5, 2009, 6 pages.
Office Action for U.S. Appl. No. 10/028,922, dated Feb. 10, 2005, 4 pages.
Office Action for U.S. Appl. No. 11/046,656, dated Feb. 17, 2009, 9 pages.
Office Action for U.S. Appl. No. 11/046,656, dated Apr. 30, 2008, 7 pages.
Office Action for U.S. Appl. No. 11/046,656, dated May 13, 2009, 9 pages.
Office Action for U.S. Appl. No. 11/366,301, dated May 25, 2010, 7 pages.
Office Action for U.S. Appl. No. 10/028,922, dated Jul. 13, 2005, 6 pages.
Office Action for U.S. Appl. No. 11/881,801, dated Jul. 23, 2009, 7 pages.
Office Action for U.S. Appl. No. 11/046,656, dated Jul. 30, 2010, 10 pages.
Office Action for U.S. Appl. No. 11/046,656, dated Sep. 8, 2009, 9 pages.
Office Action for U.S. Appl. No. 11/046,656, dated Oct. 3, 2007, 10 pages.
Office Action for U.S. Appl. No. 10/192,271, dated Oct. 8, 2003, 8 pages.
Office Action for U.S. Appl. No. 11/046,656, dated Oct. 9, 2008, 8 pages.
Office Action for U.S. Appl. No. 10/841,116, dated Oct. 12, 2006, 9 pages.
Office Action for U.S. Appl. No. 11/366,301, dated Nov. 17, 2009, 5 pages.
Office Action for U.S. Appl. No. 11/046,656, dated Dec. 1, 2010, 12 pages.
Office Action for TW Application No. 95108433, dated Mar. 31, 2011, 15 pages.

* cited by examiner

| Measurement: | 300mm metal-gate MOS capacitor gate-leakage yield | | 200mm EEPROM-based voltage and current sensors | | | | 200mm & 300mm MOS capacitor breakdown yield | |
|---|---|---|---|---|---|---|---|---|
| | 200:1 | 100,000:1 | +$V_{mean}$ & +$V_{95\%}$ | −$V_{mean}$ & −$V_{95\%}$ | +$I_{max}$ & −$I_{min}$ | $|I|<1mA/cm^2$ | 1,000:1 | 100,000:1 |
| Specification: | ≥95%@1nA($\sigma \pm 5\%$) | | $|V_{mean}|<5V$ & $|V_{95\%}|<10V$ | | | | | |
| Pre-measurement control | 100% | 100% | ~2 & ~2 | ~−2 & ~−2 | +0.0 & −0.0 | | 100% | 100% |
| Uncompensated single step | 79.1% | 32.1% | 6 & 10 | −2 & −6 | +2.0 & −0.9 | | 88% | 37% |
| Compensated single step | 97.1% | 99.5% | 3 & 5 | −2 & −4 | +0.6 & −0.3 | | 100% | 100% |
| Uncompensated multiple step | N/A | N/A | 10 & 14 | −6 & −10 | +11.0 & −2.0 | | N/A | N/A |
| Compensated multiple step | N/A | N/A | 4 & 5 | −2 & −5 | +0.9 & −0.2 | | 100% | 100% |

Table 1

FIG. 3

METHODS TO AVOID UNSTABLE PLASMA STATES DURING A PROCESS TRANSITION

CROSS-REFERENCE TO RELATED APPLICATIONS

This application claims the benefit of U.S. Provisional Application No. 60/660,662, filed on Mar. 11, 2005, by Kutney, et. al., entitled METHOD TO REDUCE PLASMA-INDUCED CHARGING DAMAGE, herein incorporated by reference in its entirety.

This application is a continuation-in-part of U.S. application Ser. No. 11/366,301, by Kutney et. al., filed Mar. 1, 2006, assigned to the present assignee, hereby incorporated by reference, which claims the benefit of the above referenced Provisional Application 60/660,662, and which is a continuation-in-part of the following U.S. Applications assigned to the present assignee, which are hereby incorporated by reference:

U.S. application Ser. No. 11/046,656, filed Jan. 28, 2005 entitled PLASMA REACTOR WITH MINIMAL D.C. COILS FOR CUSP, SOLENOID AND MIRROR FIELDS FOR PLASMA UNIFORMITY AND DEVICE DAMAGE REDUCTION, by Daniel Hoffman et al., which is a continuation-in-part of Ser. No. 10/841,116, filed May 7, 2004 entitled CAPACITIVELY COUPLED PLASMA REACTOR WITH MAGNETIC PLASMA CONTROL by Daniel Hoffman, et al., which is divisional of U.S. application Ser. No. 10/192,271, filed Jul. 9, 2002 entitled CAPACITIVELY COUPLED PLASMA REACTOR WITH MAGNETIC PLASMA CONTROL by Daniel Hoffman, et al., all of which are assigned to the present assignee; and U.S. application Ser. No. 11/046,538, filed Jan. 28, 2005 entitled PLASMA REACTOR OVERHEAD SOURCE POWER ELECTRODE WITH LOW ARCING TENDENCY, CYLINDRICAL GAS OUTLETS AND SHAPED SURFACE, by Douglas Buchberger et al., which is a continuation-in-part of U.S. application Ser. No. 10/754,280, filed Jan. 8, 2004 entitled PLASMA REACTOR WITH OVERHEAD RF SOURCE POWER ELECTRODE WITH LOW LOSS, LOW ARCING TENDENCY AND LOW CONTAMINATION by Daniel J. Hoffman et al., which is a continuation-in-part of U.S. patent application Ser. No. 10/028,922, filed Dec. 19, 2001 entitled PLASMA REACTOR WITH OVERHEAD RF ELECTRODE TUNED TO THE PLASMA by Daniel Hoffman et al., which is a continuation-in-part of U.S. patent application Ser. No. 09/527,342, filed Mar. 17, 2000 entitled PLASMA REACTOR WITH OVERHEAD RF ELECTRODE TUNED TO THE PLASMA by Daniel Hoffman et al., now issued as U.S. Pat. No. 6,528,751.

BACKGROUND

As structures fabricated on semiconductor wafers are reduced in size, charging damage associated with plasma processing becomes a serious problem. Charging damage generally occurs when structures being formed on the wafer with a plasma process, cause non-uniform charging of the structures. The non-uniform charging causes a differential voltage to form on the structures. Such a differential voltage can produce high currents or arcing in the structure that damage the structures. This can reduce yields and consequently increase manufacturing costs. As such, a need exists to provide methods capable of reducing plasma-induced charging damage during wafer processing.

SUMMARY

In some implementations, a method is provided in a plasma processing chamber for stabilizing etch-rate distributions during a process transition from one process step to another process step. The method includes performing a pre-transition compensation of at least one other process parameter so as to avoid unstable plasma states by inhibiting formation of a parasitic plasma during the process transition. In certain implementations, performing the pre-transition compensation includes increasing a chamber pressure prior to the process transition. In certain implementations, performing the pre-transition compensation includes changing a gas chemistry in the chamber to a non-reactive gas chemistry prior to the process transition. In certain implementations, performing the pre-transition compensation includes setting a source power-to-bias power ratio within a range below about 1 for the transition. In certain implementations, performing the pre-transition compensation includes reducing a magnetic field strength prior to the process transition. In certain implementations, performing the pre-transition compensation includes initiating application of a bias power on the workpiece prior to the process transition.

In some implementations, a method is provided for processing a workpiece in plasma processing chamber which includes inhibiting deviations from an expected etch-rate distribution by avoiding unstable plasma states during a process transition from one process step to another process step. This may include changing at least one process parameter with a smooth non-linear transition. In certain implementations, changing the process parameter includes gradually changing from a first steady state to a transition state and gradually changing from the transition state to a second steady state. In certain implementations, changing of the process parameter is along a Boltzmann curve, or a Sigmoidal Richards curve. In certain implementations, changing of the process parameter includes changing at least one of a plasma source power, a bias power, a gas flow, a chamber pressure, or a magnetic field strength.

In some implementations, a method is provided for avoiding unstable plasma states in a plasma processing chamber during a process transition from one process step to another process step, the method includes sequentially changing selected process parameters such that a plasma is able to stabilize after each change prior to changing a next selected process parameter. In certain implementations, changing the plurality of process parameters includes providing a non-reactive gas chemistry in the chamber prior to changing other process parameters. In certain implementations, changing the plurality of process parameters includes changing the source power after increasing a chamber pressure. In certain implementations, changing the plurality of process parameters includes changing a source power after providing a non-reactive gas chemistry in the plasma processing chamber. In certain implementations, changing the plurality of process parameters includes changing a source power after initiating application of a bias power on the workpiece.

BRIEF DESCRIPTION OF THE DRAWINGS

FIG. 2 plot B illustrates compensated transitions between process steps for plasma chamber conductance normalized to steady state.

FIG. 2 plot C illustrates a process variable with uncompensated ramp up and ramp down transitions.

FIG. 2 plot D illustrates a process variable with compensated ramp up and ramp down transitions.

FIG. 2 plot E illustrates a timing diagram with a compensated process chemistry.

FIG. 3 is a table showing plasma-induced charging damage results for single and multi-step processes before and after compensation.

DESCRIPTION

Figure 1:
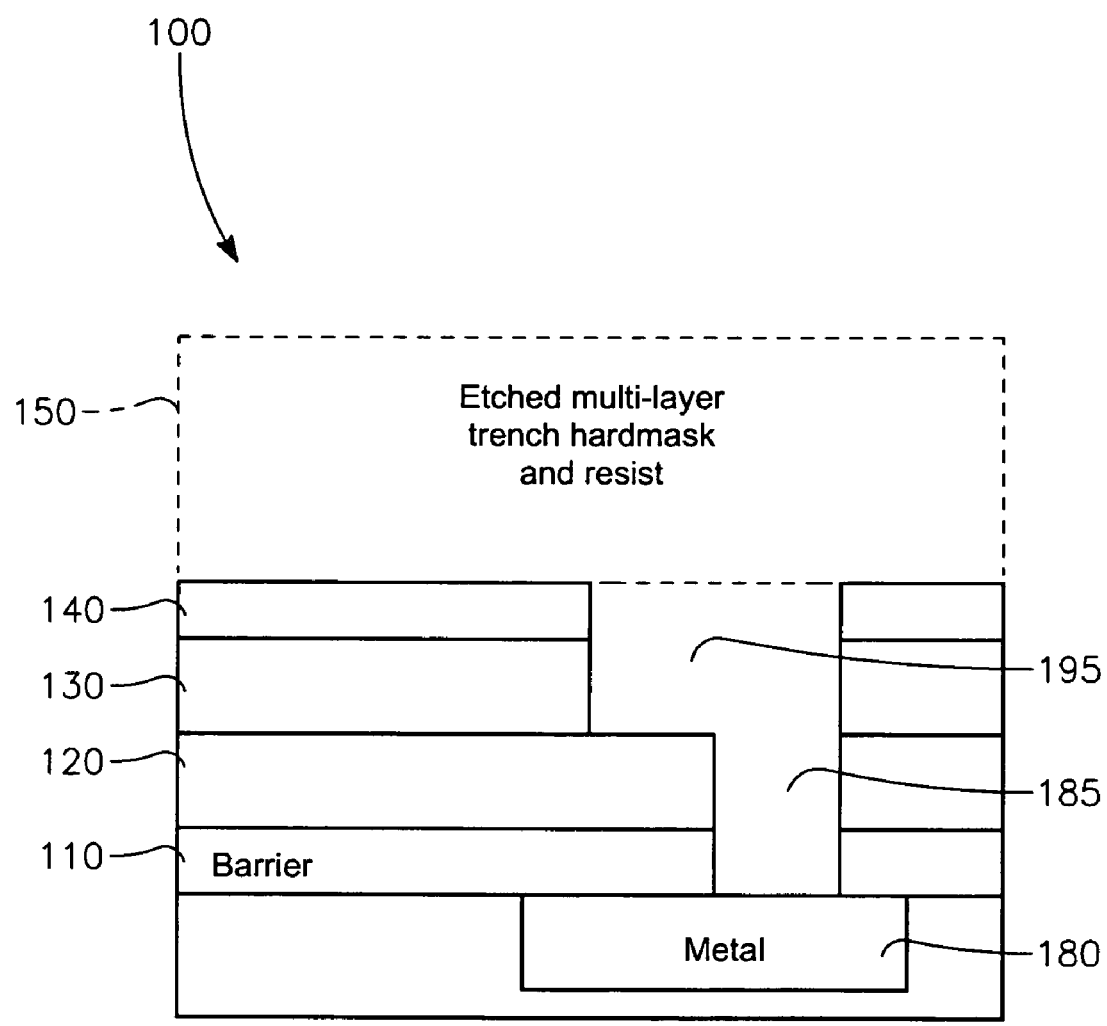
FIG. 1 is a dual-damascene stack for an all-in-one etching process.

Plasma-induced charging effects are strong functions of chamber design and process conditions. During plasma-based processing of sensitive integrated circuits, there are multiple opportunities for these devices to become damaged. The focus on reducing charge damage has been during steady-state processing steps. For example, during etching or CVD processing, plasma-induced charging damage can occur during the steady-state processing step when process parameters are essentially fixed. Damage can also occur, however, in the non-steady state periods when process parameters are changing.

The problem of plasma-induced charging damage associated with non-steady state periods exists at lower source power frequencies, as well as high frequency plasma source power. High frequency plasma source power is desirable as it is capable of providing denser plasma than low frequency plasma source power, which can facilitate high aspect ratio processing and reduces processing times. Furthermore, plasma-induced charging damage is more of a concern as gate oxides get thinner and device dimensions are getting smaller. The following teachings, however, are not limited to a specific plasma reactor, frequency, or process type, but are generally applicable in reducing charging damage and stabilization of plasma in all types of plasma processing, including deposition as well as etching.

EXAMPLE IMPLEMENTATION

Multi-Layer Dielectric Etch for Dual-Damascene Process

In this example, plasma uniformity and stability were studied in a very-high-frequency capacitively coupled dielectric-etch chamber which may be used for all-in-one processing of sub-65 nm dual-damascene structures. Empirical results indicate that excessive magnetic-field strength and step-to-step transitions are the major variables influencing charging effects. Plasma stability can be compensated by controlling these process parameters, and unstable and/or uncommon plasma states may also be avoided.

Unstable and/or uncommon plasma states can result from many anomalies such as software-control or hardware malfunctions. They may also occur when parasitic or secondary plasmas form, which impact and affect the primary plasma used to process the workpiece. The parasitic or secondary plasmas can cause unexpected etch-rate distribution deviations, e.g., uneven etching across the surface of the workpiece, or changes in the etch rate. Unstable plasma states can be controlled with step-to-step transitions to inhibit deviations from the expected etch-rate distribution (mean etch rate and uniformity). Thus, it is possible to inhibit etch-rate distribution that deviates from the otherwise expected etch-rate distribution.

During dual-damascene etching, device structures are sensitive to plasma-induced charging damage that could result in costly device-yield loss. This risk is high when metal lines are exposed through electrically transparent films or directly to the process plasma during key steps of the manufacturing sequence-low-κ dielectric etch, resist strip, and barrier removal-because charge imbalances can build up or instantaneously exceed the safe charging limit for a device during any one of these steps.

The risk of plasma charging damage during via 185 or trench 195 etch depends on the integration scheme used in forming the dual-damascene structure. Shown in FIG. 1 is an all-in-one etch sequence of a more than seven layer dual-damascene structure suitable for the sub-65 nm node. The layers 110-150 (layer 150 shown in phantom is an etched hardmask and resist multi-layer) are a combination of resist, hardmask, dielectric material, and barrier layers. During the continuous multi-step etching of a dual-damascene stack with more than seven layers for the formation of trench 195 and via 185 structures, the trench and via steps have the highest risk of plasma-induced charging damage because of via-bottom metal 180 exposure. This sequence was developed in a very-high-frequency capacitively coupled dielectric etcher and employs multiple steps with different source and bias power combinations to effectively etch diverse materials comprising the multiple layers 110-150 of the dual-damascene stack 100.

During the etching of the multi-layer dual-damascene stack 100 for both trench 195 and via 185 structure formation with multiple steps, via and trench steps have the highest risk of plasma-induced charging damage because of via-bottom metal 180 exposure.

Figure 2:
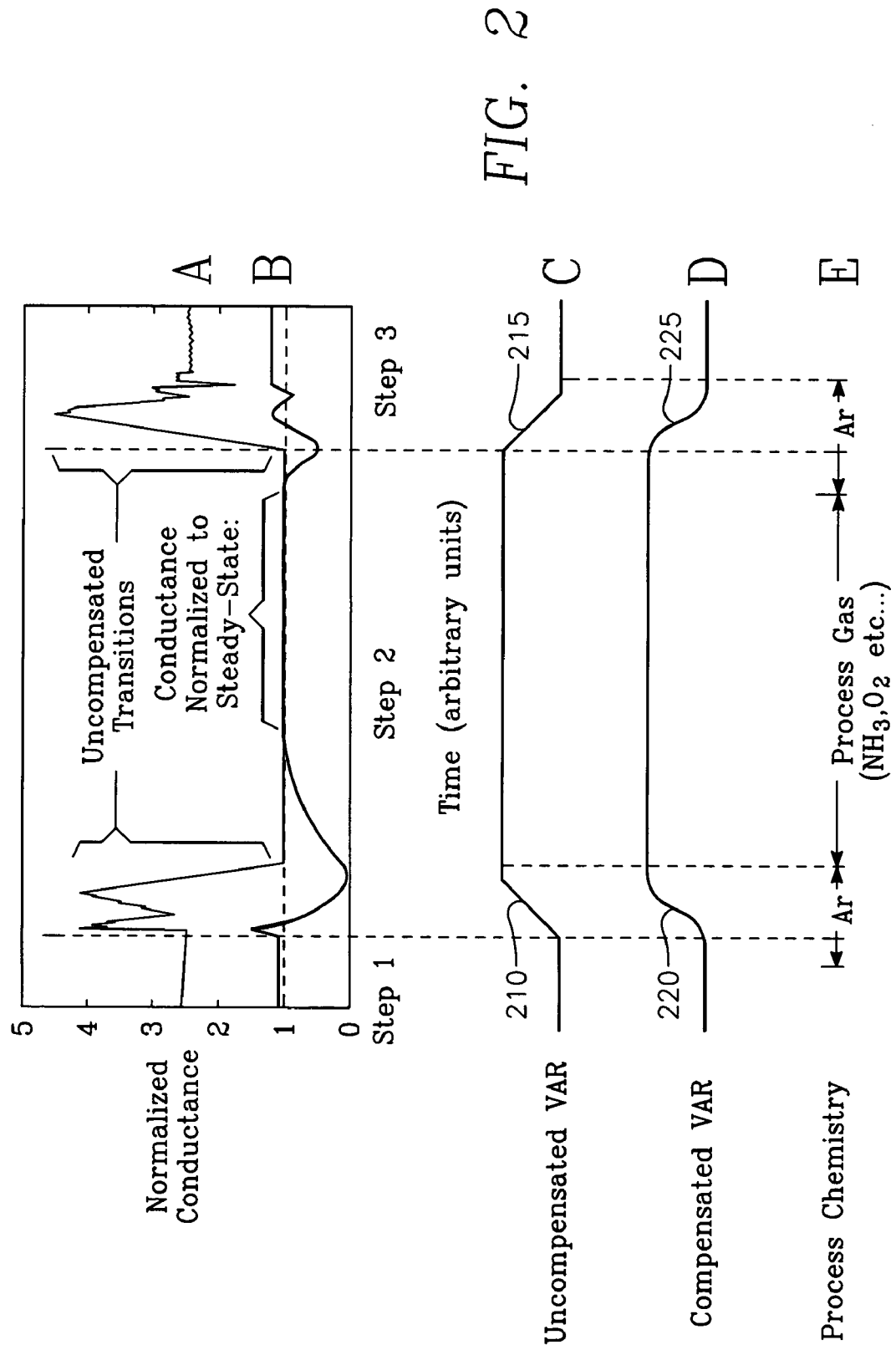
FIG. 2 plot A illustrates uncompensated transitions between process steps for plasma chamber conductance normalized to steady state.

Turning to FIG. 2, plasma instability during transitions from one plasma condition to another is a risk factor. Multiple process parameters are usually changed between steps in the etch sequence, including bias power, source power, pressure, magnetic field (which in some reactor types may be controlled with a charge species tuning unit or CSTU), and chemistry. During transitions between any two steps, adjusted process parameters are ramped to new setpoints in a simple linear fashion, as shown at 210 or 215 of plot C, or without any control whatsoever. In addition, these process parameters are simultaneously changed at the beginning of each step, often giving rise to situations in which multiple parameters are significantly changing before settling to their step set points.

Empirical data have revealed that uncompensated transitions increase the risk of plasma-induced charging damage and increase the existence of unstable and uncommon plasma states, because the plasma undergoes significant distribution, density, and energy changes. This uncompensated change can be represented by plasma conductance, which characterizes the energy allowed to flow through the plasma. As shown in FIG. 2, plot A, for typical uncompensated transitions, conductance varies significantly in magnitude over time during transitions to and from the steady-state etching condition, shown in Step 2. In addition, the conductance at the beginning and after Step 2 clearly deviates from the steady-state etch-step value. All of the indicators suggest that the plasma is undergoing significant change during transitions.

In FIG. 2, plot B shows transitions that were compensated to produce more stable plasma during transitions. As shown in FIG. 2, plot B, conductance excursions have been substantially reduced, and conductance at the beginning and after the etch Step 2 no longer deviates significantly from the steady-state conductance in Step 2. These improvements result from careful control and sequencing of process parameters, discussed further below, that are undergoing change and which may be implemented universally throughout the etch, or any other plasma processing sequence.

Thus, FIG. 2 shows that with the plasma conductance normalized with the steady-state conductance of a single-step process, the uncompensated transitions of plot A are marked by large excursions, while the compensated transitions of plot B are generally smoother with smaller excursions. These changes indicate that the compensated plasma is more stable while transitioning from one plasma state to another.

FIG. 3 shows that experimental data corroborate the reduction in damage risk when compensated transitions are used. The extent to which risk is reduced in a single-step etch process is show in Table 1 of FIG. 3. Specifically, uncompensated transitions result in 32% and 79% leakage-current yields for 200:1 and 100,000:1 antenna ratios, respectively. These yields improve to 97% and 99.5% with compensated transitions. Likewise, EEPROM-based sensor results for the single-step etch show similar improvements, as shown in Table 1. Mean and 95%-confidence-interval positive voltages and currents drop below the EEPROM-based thresholds. Finally, external-source gate-breakdown voltages meet the 100% yield criterion when compensated transitions are used. With uncompensated transitions, the yields for 1,000:1 and 100,000:1 antenna ratios are 88% and 37%, respectively, both of which are unacceptable.

To verify the robustness of the transient-compensation solution, a multi-step sequence for etching a complex multilayer dual-damascene stack was tested using EEPROM-based sensors. EEPROM-based sensors results, evaluated with the uncompensated multi-step sequence, reveal a very large damage risk as indicated by large voltage and current responses, shown in Table 1 of FIG. 5. With compensated transitions incorporated into the same sequence, EEPROM-based sensor voltages and currents are reduced to acceptable levels. In addition, the 200 mm antenna MOS capacitor gate-breakdown voltages meet the 100% yield criterion. Based on these data, plasma instabilities and the risk of plasma-induced charging effects can be minimized by compensating transitions between consecutive plasma-etching steps.

Thus, in the context of dual-damascene process, a high risk factor that contributes to plasma-induced-charging sensitivity can be compensated to reduce plasma charging damage. The plasma instability that can occur during transitions from one plasma state to another can be compensated. By continuously controlling the plasma state during a transition, the plasma is more stable, and charging effects can be reduced. With this risk factor mitigated, continuous etch processes can be developed, such as etching and ashing of complex multi-layer stacks, without plasma-charging-damage issues. This capability makes possible all-in-one via and trench etching, which is desirable for dual-damascene processes.

Further Parameter Control to Improve Plasma Stability and/or Reduce Charging Damage During Transitions Further, carefully controlling process parameters and, hence the plasma state during transitions between multiple processing steps, and by introducing and controlling steady-state transition steps, plasma-induced charging damage may be controlled and the recommended process operation window significantly increased.

Discussed further below are process parameters that may be utilized to reduce plasma damage and/or avoid unstable plasma states. By controlling the process power and power ratio; the process pressure; the process chemistry; the magnetic field strength; and the transition ramp starting points, rates, and rate shapes for the above mentioned parameters, charging damage and/or deviations from expected etch-rate distributions can be reduced. Although the below discussion is discussed with reference to charging damage, the following applies to reducing parasitic plasma and unexpected etch-rate distribution deviations cause therefrom.

Controlling Power Ratio Source-Frequency-Based Processes

Figure 4A:
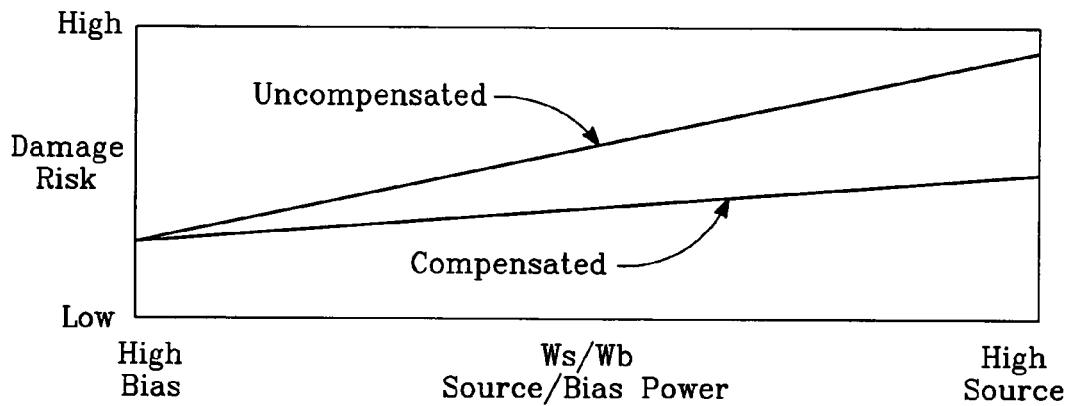
FIG. 4A is a graphical representation showing a conceptual charge damage risk as a function of source power-to-bias power ratio for compensated and uncompensated processes.

A way to reduce charging damage is to ensure that the power ratio between source power and bias power is within a low damage-risk regime. FIG. 4A is a graphical representation showing a conceptual charge damage risk as a function of source power-to-bias power ratio. Charging damage risks are encountered in a source-frequency-based process without bias power. It has been determined that using a source-only plasma increases the risk since the sheath thickness is thinner and likely less stable, as indicated at the right side of FIG. 4A. As a result, the damage risk is higher since unusually large voltage and current gradients may develop at some point during the process. When the sheath thickness is increased with low bias frequency, charging damage reduction is observed, demonstrating that the wafer damage is influenced by the sheath. Thus, to reduce charging damage, a low source/bias power ratio $W_s/W_b$ is desirable, for example within a range below approximately 1, with some minimum amount of bias power applied.

The low-frequency power is set within a threshold range to maintain sufficient sheath for high frequency source powered processes without increasing the damage risk. This low-frequency power is dependent on plasma density and reactor type, but typically would be on the order of 100 W in an ENABLER reactor, available from Applied Materials, Inc., Santa Clara, Calif., which has an etching tool capable of operating at high frequencies greater than 100 MHz source power.

Related to this is the success in minimizing damage when the power ratio is controlled and maximized. When the source-to-bias power ratio is small, the damage risk is in general, smaller, especially with the magnetic field, since the risk is higher with higher bias powers and magnetic fields. On the other hand, as more source power is applied, the damage-free window increases with equivalent magnetic-field strengths.

Thus, to reduce charging damage, source power only processes should be avoided and some amount of lower frequency bias power applied. In addition, this is true even for plasma strike, plasma quench, and dechucking. Damage risk has been observed by the present inventors to be lower during any process when low frequency bias power is applied during the usually high-frequency-only process.

Often, a magnetic field is used during source-frequency based processing in order to redistribute the charged species such as the etchant radicals. When sufficient magnetic field is used, the etch rate across the wafer becomes increasingly uniform. Thus, the magnetic field control is a powerful uniformity-tuning knob. A consequence of using large magnetic fields is an increase in the damage risk since the voltage and current distributions are often negatively impacted when excessive field is employed.

Use Higher Pressure to Stabilize Plasma in Transition

Figure 4B:
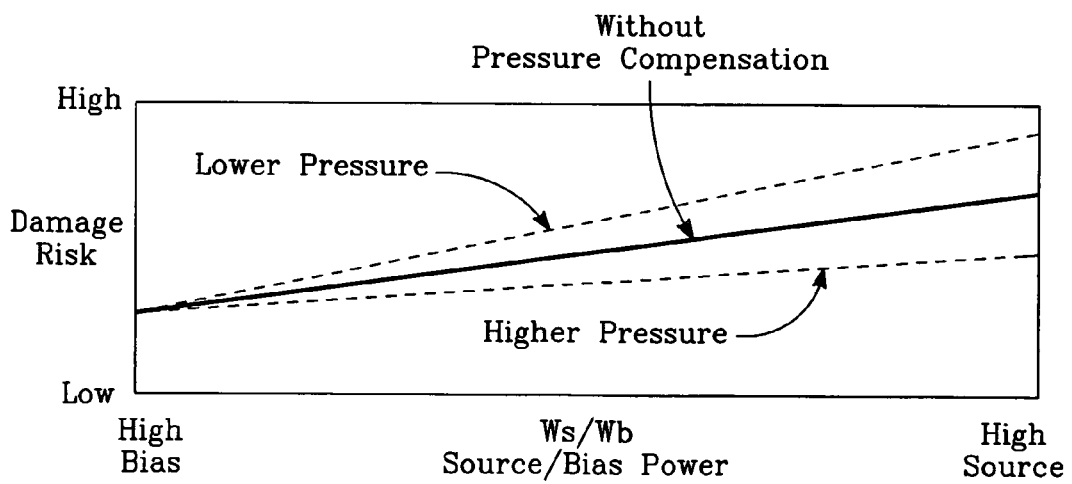
FIG. 4B is a graphical representation showing a conceptual charge damage risk as a function of source power-to-bias power ratio showing the effects of lower and higher pressure.

An additional factor in reducing charge damage is to control the process stability during transition steps by increasing pressure. FIG. 4B is a graphical representation showing a conceptual charge damage risk as a function of source power-to-bias power ratio showing the effects of lower and higher pressure. As shown in FIG. 4B, if the pressure is increased, there is lower risk of damage during transitions as indicated by the dashed Higher Pressure line. The higher pressure stabilizes the plasma impedance and minimizes the damage risk, as compared to process transitions without pressure compensation. Thus, increasing pressure prior to transitioning the other parameters reduces the risk of charging damage occurring between process steps. Conversely, if the pressure is decreased, the risk of charging damage is increased as compared to process transitions without pressure compensation, as indicated by the Lower Pressure line.

Controlling Transitions Between Process Steps

Another way to reduce charging damage is to control the process ramp starting points, rates, and rate shapes for process parameters such as source power, bias power, magnetic field strength, and pressure. The plasma-induced charging damage is sensitive to the transition from one process state to another. This sensitivity is also dependent on the approach to the next processing condition. There are a number of possibilities for each variable and an even larger number when the variables are changed at the same time. For example, the current approach is to simultaneously perform a linear ramp over a period of order one second from one processing step to another for each variable that requires a change, as illustrated in FIG. 2, plot C of the Uncompensated VAR at 210 or 215. These variables include low frequency bias power, high frequency source power, and magnetic field strength. Other variables, however, such as pressure, temperature, gas flows, and backside helium pressures are several variables are programmed to reach their next set point as quickly as possible (infinite ramp rates). In the past, power and magnetic field strength ramp rates were fixed at approximately 1,000 W/s and 10 A/s, respectively.

To inhibit charging damage, however, power and magnetic field strength ramp rates, as well as the other parameters, should not be instantaneously large or extremely small. Furthermore, the plasma is more stable during transitions when ramp rates are smooth, e.g., without an instantaneous in slope, such as if they simulate a Boltzmann curve or a Sigmoidal Richards curve. A Boltzmann curve for example may be represented as:

$$y = \frac{A_1 - A_2}{1 + e^{(x-x_0)/dx}} + A_2$$

where
$A_1$ is the initial value,
$A_2$ is the final value,
$x_0$ is the center point, and
$dx$ is the time constant for the slope of the curve at $x_0$
A Boltzmann curve is illustrated in FIG. 3, plot D of the Compensated VAR at 220 or 225, in the transition between process Step 1 and Step 2 and between process Step 2 and Step 3, respectively. Transitions of this nature allow the plasma impedance to respond smoothly without shocking the plasma.

Additional evidence supports the delay of changing one or more parameters so that the plasma has time to react to these multiple changes. One example of this is to ramp the power while maintaining a high pressure and, for example, an argon environment. Then, the non-reactive gas is replaced by the process gas, followed by a drop (or increase) in pressure to the final processing pressure.

Control of Process Chemistry

A way to reduce charging damage is to control the process chemistry during transitions by introducing alternative chemistries that minimize the damage risk. Source-frequency based processes are often used to remove organic films and typically do not use sputtering-type gases such as, but not limited to, argon. In some applications, the organic-removing gas such as oxygen is flowing inside the etcher prior to and after high source power is applied and removed, respectively. It has been determined, however, that during the source power ramp up to and ramp down from the steady-state high power, it is desirable to have a non-reactive gas such as argon in the etcher. It is during this period of time which is typically of order one second that other process variables are also changing from one state to another. Once variables reach their final processing state, then the chemistry can be safely switched with respect to plasma-induced-charging damage. Likewise, before the steady-state processing condition is ramped to next state (not necessarily ramped down), argon, or other non-reactive gas, is needed in the etcher in order to reduce the concentrations of the reactive process gas.

Typically, etcher residence times of order one to three seconds are required in order to substantially change the etchant gas concentration. This time must include the time for the neutral gas to travel from the valve at the gas panel to the reactor chamber. By using this gas flushing step, monitoring wafers have reported a lower damage risk.

As shown in FIG. 2 plot E, the process chemistry may include the introduction of Ar, or other non-reactive gas, for about 3-5 seconds to ensure that the Ar has been introduced to the plasma chamber to dilute the etchant gas concentration prior to process variable transition. Thus, Ar gas is flowed several seconds prior to ramp up 210 or 220 of a process variable to account for resident time for the Ar to travel from the gas panel and into the chamber. This ensures that Ar dilutes the reactive gas prior to transition of the process variable(s). Similarly, Ar gas is flowed for several seconds prior to ramp down 215 or 225, of a process variable. Although Ar flow is indicated beyond ramp up 210 or 220 and ramp down 215 or 225, gas type may be changed back to reactive gas prior to the end of the transition 210, 215, 220, or 225 so long as sufficient resident Ar gas is delivered to, or remains in the chamber beyond the transition 210, 215, 220, or 225.

In one particular implementation, it has been observed that if the source power-to-bias power ratio $W_s/W_b$ is greater than about 1, introducing Ar prior to a transition greatly reduces the risk of charge damage. Further, it is anticipated that other compensation means could be employed instead of, or in addition to, non-reactive gas introduction to significantly reduce the risk of charging damage when the source/bias power ratio $W_s/W_b$ is above about 1.

As indicated above, although inert gases may be used as the non-reactive gas, in other implementations other diluent gases may be used. For example, it is anticipated that in some processes, nitrogen, or the like, may be used. Thus, the non-reactive gas need not be an inert gas, in this context, but instead can be a gas that dilutes the reactive gas and limits the change of the conductance (or impedance) of the plasma during a transition.

Controlling the B-Field Vector

Yet another way to reduce charging damage is to control the B-field strength (magnitude) and direction of the B-field during transitions in order to minimize the damage risk from magnetic-field-induced voltage and current gradients and fluctuations. Investigations have also been performed with several magnetic-field configurations which alter the radial $B_r$ and axial $B_z$ components of the magnetic field across the wafer surface. When the radial component is zero along the entire wafer surface, the magnetic field is in its mirror configuration since only axial fields will exist along the wafer surface. The other extreme is the cusp configuration when the axial field is zero, while the radial component is nonzero. An example of a cusp configured reactor is disclosed in U.S. Pat. No. 5,674,321, by Pu and Shan, issued Oct. 7, 1997, entitled METHOD AND APPARATUS FOR PRODUCING PLASMA UNIFORMITY IN A MAGNETIC FIELD-ENHANCED PLASMA REACTOR, assigned to Applied Materials, Inc., Santa Clara, Calif., herein incorporated by reference in its entirety.

The cusp configuration has a substantially reduced the level of damage as compared to the mirror configuration. Thus, the damage risk is proportional to axial field strength. As mentioned previously, the use of source power with a large source-to-bias power ratio increases the damage-free window size which may be further increased if the axial field strength is reduced.

The approaches disclosed herein, however, which are used to minimize the damage risk, will also affect the semiconductor material in the etcher. These approaches may also provide benefit to the process which is to ultimately alter the material in a controlled fashion. Certain materials are sensitive to process parameters and by slowing, speeding, offsetting, and/or changing the approach midstream to the final state, the material will be affected.

Nevertheless, by carefully controlling process parameters and, hence the plasma state during transitions between multiple processing steps and by introducing and controlling steady-state transition steps, plasma-induced charging damage may be controlled and the recommended process operation window significantly increased. In order to achieve this reduction, the process chemistry is controlled during step transitions by introducing alternative chemistries that minimize the damage risk and instantaneous plasma non-uniformities. Alternatively, or in addition, the process pressure may be controlled during transition steps and step transitions by increasing pressure, which stabilizes the plasma impedance and minimizes the damage risk. Further, the process power may be controlled during transition steps such as between plasma processing steps, during the plasma formation (plasma strike), and during the dechucking step (plasma quenching) by maintaining a minimum low frequency bias power level (of order 100 W), which maintains a sufficient plasma sheath thickness and minimizes the damage risk. Moreover, the B-field strength (magnitude) and direction of the magnetic B-field may be controlled during transition steps and step transitions in order to minimize the damage risk from magnetic-field-induced voltage and current gradients and fluctuations. Furthermore, the process ramp starting points, rates, and rate shapes for the above mentioned parameters may be controlled since optimized values stabilize the plasma and minimize the damage risk. The power ratio of the multiple RF power sources operating at typical low and high fixed frequencies may be controlled since the damage risk is minimized with particular power ratios.

Referring to FIG. 2, plots A & B, in some implementations, the conductance, or impedance, of the plasma is used as a surrogate, to determine if charging damage is likely to occur during a transition. The plasma parameters, discussed herein, may be compensated so that the reactance, i.e. the impedance/conductance of the plasma does not contain excursions greater than some threshold value. The threshold for the acceptable excursion values of the plasma impedance/conductance from its steady state value (either pre-transition or post transition steady state value), will be dependent on the chamber, the process type, and the process parameters.

As such, the impedance/conductance of the plasma may be monitored during the steady state and compared to the impedance/conductance of the plasma during the transition to develop a compensation scheme for a specific process. A maximum deviation of the impedance/conductance in some implementations may be a percentage value, while in others it may be an absolute value. For example, if the impedance/conductance increases more than approximately 200% of its steady value, additional compensation would be provided. Conversely, if the impedance/conductance value decreases by 50%, compensation in the form of increased bias, for example, could be provided to limit such an impedance/conductance excursion. Similarly, a threshold range value for the impedance/conductance may be used in determining whether charging damage is likely to occur. The acceptable excursion percentage will vary based on process type, process parameters, chamber type, and device structures and tolerances. Therefore, the proper type and amount of compensation may be determined based on impedance/conductance measurements. Furthermore, transitions may be limited based on plasma impedance/conductance measurements.

Similarly, other methodologies such as spectroscopy and/or plasma voltage/current measurements, alone or in combination with impedance/conductance measurements, may be used as a surrogate to determine whether charging damage is likely to occur. Further, it also is possible to use the above methodologies, impedance/conductance, spectroscopy (e.g. optical, endpoint technologies, etc.), or voltage/current, or combinations thereof, to inhibit deviations from the expected etch-rate distribution resulting from parasitic or secondary plasma.

As such, one or more of the measured surrogate characteristics are monitored during steady state processing and during a process transition. The change of one or more of the surrogate characteristics through the process transition is limited to inhibit charging damage, and/or to avoid unexpected etch-rate distribution deviations caused by parasitic or secondary plasmas. (It should be noted that charge damage is not always caused by unstable plasma, and, unstable plasma can cause unexpected etch-rate distribution deviations without causing damage).

The implementations disclosed herein are not limited to two frequencies, i.e. lower frequency bias power and higher frequency source power. Three or more frequencies may be used in some implementations. Moreover, certain implementations may use other than RF frequency, for example microwave, infrared, or x-ray. Furthermore, some or all of the various compensation implementations and approaches disclosed herein may be combined to further reduce the risk of charging damage.

While the invention herein disclosed has been described by the specific embodiments and implementations, numerous modifications and variations could be made thereto by those skilled in the art without departing from the scope of the invention set forth in the claims.

What is claimed is:

1. A method of etching in a plasma processing chamber comprising:
   conducting a process transition from one process step to another process step, wherein the process transition comprises changing of at least one process parameter; and
   performing a pre-transition compensation of at least one other process parameter so as to avoid unstable plasma states by inhibiting formation of a parasitic plasma during the process transition.

2. The method of claim 1 wherein performing the pre-transition compensation comprises increasing a sheath size above a workpiece being processed by initiating application of a bias power prior to the process transition.

3. The method of claim 1 wherein performing a pre-transition compensation comprises increasing a chamber pressure prior to the process transition.

4. The method of claim 3 further comprising reducing the chamber pressure for processing after the process transition.

5. The method of claim 3 wherein performing the pre-transition compensation comprises increasing a chamber pressure prior to the process transition if a source power-to-bias power ratio is greater than about 1.

6. The method of claim 3 wherein performing the pre-transition compensation comprises setting a source power-to-bias power ratio within a range below about 1 for the transition.

7. The method of claim 3 wherein performing the pre-transition compensation comprises initiating a bias power prior to the process transition.

8. The method of claim 7 wherein initiating the bias power comprises setting bias power to about 100 W prior to the process transition.

9. The method of claim 1 wherein performing the pre-transition compensation comprises changing a gas chemistry in the chamber to a non-reactive gas prior to the process transition.

10. The method of claim 9 further introducing a reactive gas after the process transition for processing a workpiece.

11. The method of claim 9 wherein performing the pre-transition compensation comprises changing a gas chemistry in the chamber to a non-reactive gas prior to the process transition if a source power-to-bias power ratio is greater than about 1.

12. The method of claim 9 wherein introducing the non-reactive gas into the plasma processing chamber prior to the process transition comprises starting a flow of the non-reactive gas to the process chamber before the process transition at a time prior to the process transition greater than a residence time of the non-reactive gas to arrive from a gas panel to the processing chamber.

13. The method of claim 12 wherein introducing the non-reactive gas into the plasma processing chamber comprises introducing argon at least 2 seconds prior to the process transition.

* * * * *